United States Patent
Yun et al.

(10) Patent No.: US 7,846,796 B2
(45) Date of Patent: Dec. 7, 2010

(54) SEMICONDUCTOR DEVICES INCLUDING BURIED BIT LINES

(75) Inventors: Jong-Ho Yun, Suwon-si (KR);
Byung-Hee Kim, Seoul (KR);
Dae-Yong Kim, Yongin-si (KR);
Hyun-Su Kim, Hwaseong-si (KR);
Eun-Ji Jung, Hwaseong-si (KR);
Eun-Ok Lee, Hwaseong-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 12/791,692

(22) Filed: Jun. 1, 2010

(65) Prior Publication Data

US 2010/0237423 A1     Sep. 23, 2010

Related U.S. Application Data

(62) Division of application No. 11/757,906, filed on Jun. 4, 2007, now Pat. No. 7,749,840.

(30) Foreign Application Priority Data

Jun. 9, 2006   (KR) .................. 10-2006-0052073

(51) Int. Cl.
*H01L 21/336*   (2006.01)
*H01L 21/425*   (2006.01)
*H01L 21/44*    (2006.01)

(52) U.S. Cl. .................. 438/262; 438/257; 438/287; 438/528; 438/664

(58) Field of Classification Search .................. None
See application file for complete search history.

(56) References Cited

U.S. PATENT DOCUMENTS

| | | | |
|---|---|---|---|
| 4,261,800 A * | 4/1981 | Beckenbaugh et al. ...... 205/118 |
| 6,194,755 B1 | 2/2001 | Gambino et al. |
| 6,365,944 B1 | 4/2002 | Reisinger et al. |
| 6,548,861 B2 | 4/2003 | Palm et al. |
| 6,573,545 B2 | 6/2003 | Kim et al. |
| 6,828,199 B2 | 12/2004 | Ogura et al. |
| 2007/0222019 A1 | 9/2007 | Rochefort et al. |

FOREIGN PATENT DOCUMENTS

JP      2002-508594      3/2002

(Continued)

OTHER PUBLICATIONS

English language abstract of Japanese Publication No. 2001-0042141.

(Continued)

*Primary Examiner*—Ha Tran T Nguyen
*Assistant Examiner*—Valerie Brown
(74) *Attorney, Agent, or Firm*—Myers Bigel Sibley & Sajovec, PA (57) ABSTRACT

A semiconductor device includes a plurality of channel structures on a semiconductor substrate. A bit line groove having opposing sidewalls is defined between sidewalls of adjacent ones of the plurality of channel structures. A plurality of bit lines are formed on corresponding ones of the opposing sidewalls, and the plurality of bit lines are electrically isolated from each other

5 Claims, 7 Drawing Sheets

FOREIGN PATENT DOCUMENTS

| | | |
|---|---|---|
| KR | 1998-0011894 | 4/1998 |
| KR | 2001-0042141 | 5/2001 |
| KR | 2001-0112829 | 12/2001 |
| KR | 10-2004-0096339 | 11/2004 |

OTHER PUBLICATIONS

English language abstract of Korean Publication No. 2001-0112829.
English language abstract of Japanese Publication No. 2002-508594.

* cited by examiner

SEMICONDUCTOR DEVICES INCLUDING BURIED BIT LINES

CROSS-REFERENCE TO RELATED APPLICATIONS

The present application is a divisional of and claims priority from U.S. patent application Ser. No. 11/757,906, filed Jun. 4, 2007, now U.S. Pat. No. 7,749,840 which claims the benefit of Korean Patent Application No. 10-2006-0052073, filed on Jun. 9, 2006, the disclosures of which are hereby incorporated by reference herein in their entireties.

BACKGROUND

1. Field of Invention

Embodiments of the present invention relate generally to methods of forming semiconductor devices including a buried interconnection line and, more particularly, to methods of forming semiconductor devices including a buried bit line.

2. Description of the Related Art

As semiconductor devices become more highly integrated, transistors included therein shrink in size. Shrinkage of the transistors leads to a reduction of active regions, in size, where the transistors are formed. Accordingly, the transistors of highly integrated semiconductor devices may suffer from a short channel effect and/or a narrow width effect.

A three dimensional transistor such as a vertical transistor has been proposed instead of a conventional planar transistor in order to increase a channel length and/or a channel width in a limited area. Vertical transistors may be very useful to semiconductor memory devices such as dynamic random access memory (DRAM) devices. In a conventional DRAM device employing the vertical transistor as a memory cell transistor, a bit line of the DRAM device may be formed using an ion implantation technique. In this case, there may be a limitation in reducing an electrical resistance of the bit line. Therefore, a method of forming a buried bit line has been proposed to decrease the electrical resistance of the bit line.

In general, buried bit lines may be formed by etching a semiconductor substrate to form a groove and forming a conductive layer on an entire surface of the semiconductor substrate with the groove using a chemical vapor deposition (CVD) technique. The conductive layer may then be etched back to form a pair of separate bit lines on both sidewalls of the groove respectively. The thickness of the conductive layer should be increased in order to decrease the electrical resistance of the bit lines. However, as the integration density of the semiconductor device increases, the width of the groove may be reduced. In this case, there is a limitation in increasing the thickness of the conductive layer. In the event that the thickness of the conductive layer increases, the conductive layer may be formed to have overhangs on upper corners of the groove and the overhangs may be in contact with each other. Therefore, the conductive layer on the bottom surface of the groove may not be removed while the conductive layer is etched back to form the bit lines. This may be due to the presence of the overhangs. As a result, it may be difficult to form a pair of low resistive bit lines, which are electrically isolated from each other, in the narrow groove.

SUMMARY

An embodiment exemplarily described herein can be generally characterized as a method of forming a semiconductor device that includes removing a portion of a semiconductor substrate to define a first groove therein, the first groove comprising a sidewall and a bottom surface; and forming a buried interconnection within the first groove. The buried interconnection may be formed, for example, by applying an electroless deposition process to form a metal layer on the sidewall and the bottom surface of the first groove; and reacting the semiconductor substrate and the metal layer to form a metal silicide layer on the sidewall and the bottom surface of the first groove.

Another embodiment exemplarily described herein can be generally characterized as a method of forming a semiconductor device that includes removing a first portion of a semiconductor substrate to form a channel structure; forming a gate pattern on a sidewall of the channel structure; removing a second portion of the semiconductor substrate adjacent to the sidewall of the channel structure to form a bit line groove having a sidewall and a bottom surface; and forming a bit line within the bit line groove. The first portion of the semiconductor substrate may extend from a top surface of the semiconductor substrate to a level below the top surface of the semiconductor substrate and the sidewall of the channel structure may extend from the level below the top surface of the semiconductor substrate toward the top surface of the semiconductor substrate. The bit line may be formed, for example, by applying an electroless deposition process to form a metal layer on the sidewall and the bottom surface of the bit line groove; and reacting the semiconductor substrate and the metal layer to form a metal silicide layer on the sidewall and the bottom surface of the bit line groove.

Yet another embodiment exemplarily described herein can be generally characterized as a method of fabricating a semiconductor device that includes removing a first portion of a semiconductor substrate to form a channel structure; forming a gate insulation layer on a sidewall of the channel structure; forming a gate pattern on a sidewall of the gate insulation layer; removing a second portion of the semiconductor substrate adjacent to the channel structure to form a bit line groove having a sidewall and a bottom surface; forming a bit line within the bit line groove; and forming a word line electrically connected to the gate pattern. The first portion of the semiconductor substrate may extend from a top surface of the semiconductor substrate to a level below the top surface of the semiconductor substrate and the sidewall of the channel structure may extend from the level below the top surface of the semiconductor substrate toward the top surface of the semiconductor substrate. The bit line may be formed, for example, by applying an electroless deposition process to form a metal layer on the sidewall and the bottom surface of the bit line groove; reacting the semiconductor substrate and the metal layer to form a metal silicide layer on the sidewall and the bottom surface of the bit line groove; and removing a portion of the metal silicide layer on the bottom surface of the bit line groove.

Still another embodiment exemplarily described herein can be generally characterized as a semiconductor device that includes a semiconductor substrate having an upper surface; a plurality of channel structures on the substrate, wherein each channel structure has a sidewall extending from the upper surface of the semiconductor substrate to a height above the upper surface of the semiconductor substrate; a plurality of gate patterns formed on sidewalls of corresponding ones of the plurality of channel structures; a bit line groove defined between sidewalls of adjacent ones of the plurality of channel structures, the bit line groove having opposing sidewalls; and a plurality of bit lines formed on corresponding ones of the opposing sidewalls, wherein the plurality of bit lines are electrically isolated from each other.

BRIEF DESCRIPTION OF THE DRAWINGS

The above and other features and advantages of the exemplary embodiments of the present invention will become more apparent to those of ordinary skill in the art by describing in detail exemplary embodiments thereof with reference to the attached drawings in which.

DETAILED DESCRIPTION

Exemplary embodiments of present invention will now be described more fully hereinafter with reference to the accompanying drawings. These exemplary embodiments may, however, be realized in many different forms and should not be construed as limited to the embodiments set forth herein. Rather, these embodiments are provided so that this disclosure will be thorough and complete, and will fully convey the scope of the invention to those skilled in the art.

It will be understood that when a material layer such as a conductive layer, a semiconductor layer or an insulation layer is referred to as being "on" another material layer or substrate, it can be directly on the other material layer or substrate or intervening layers may be present therebetween.

It will be understood that, although the terms first, second, third, etc. may be used herein to describe various material layers or process steps, these layer or process steps should not be limited by these terms. These terms are only used to distinguish a specific material layer or process step from another material layer or process step.

In the specification, a "substrate" or a "semiconductor substrate" may comprise an arbitrary semiconductor-based structure having a silicon surface. For example, the semiconductor based structure may comprise a silicon substrate, a silicon-on-insulator (SOI) substrate, a doped or undoped silicon layer, a silicon epitaxial layer supported by a semiconductor structure, or another semiconductor structure. The semiconductor structure may comprise a silicon-germanium (SiGe) layer, a germanium layer or a gallium arsenide (GaAs) layer. Further, the "substrate" or the "semiconductor substrate" may be a substrate on which an insulation layer or a conductive layer is formed.

The terms "row" and "column" are merely used to indicate two different directions on a substrate. For example, the terms "row" and "column" may be respectively parallel to an x-axis and a y-axis, or vice versa. However, these terms may not indicate only vertical and horizontal directions that intersect at a right angle.

Exemplary embodiments of the present invention are generally directed to methods of forming buried interconnections. In the exemplary embodiments, a buried interconnection may include a conductive line in a groove which is formed by etching a semiconductor substrate. The exemplary embodiments may be applied to forming a buried bit line in DRAM devices employing vertical transistors as cell transistors or forming common source lines in flash memory devices. The embodiments of the invention will be described hereinafter in conjunction with a silicon substrate as a semiconductor substrate. However, the semiconductor substrate in the exemplary embodiments may not be limited to the silicon substrate, as mentioned above.

One embodiment exemplarily described herein can be generally characterized as a method of manufacturing a buried bit line that includes forming a groove in a semiconductor substrate and selectively forming a conductive layer in the groove (e.g., on a sidewall and bottom surface of the groove using an electroless deposition process). Accordingly, the conductive layer may be conformably formed in the groove such that the portion of the conductive layer on the sidewall of the groove may have substantially the same thickness as the portion of the conductive layer on the bottom surface of the groove. In addition, an annealing process may be performed after formation of the conductive layer to form a metal silicide layer that act as bit lines. Therefore, the electrical resistance of the bit lines may be reduced.

In some embodiments, the conductive layer for the bit lines may comprise one or more suitable conductive material layers which can be formed using an electroless depositing technique. Further, the conductive layer for the bit lines may comprise one or more conductive material layers which can produce a silicide layer through an annealing process. The conductive layer may include a refractory transition metal. For example, the conductive layer may include cobalt (Co), nickel (Ni), titanium (Ti), platinum (Pt), or the like or combinations thereof. While some embodiments will be described hereinafter with reference to a conductive layer including cobalt (Co), it will be appreciated that the conductive layer for the bit lines may not be limited to cobalt (Co) but may be any one or more suitable conductive material layers.

Figure 1:
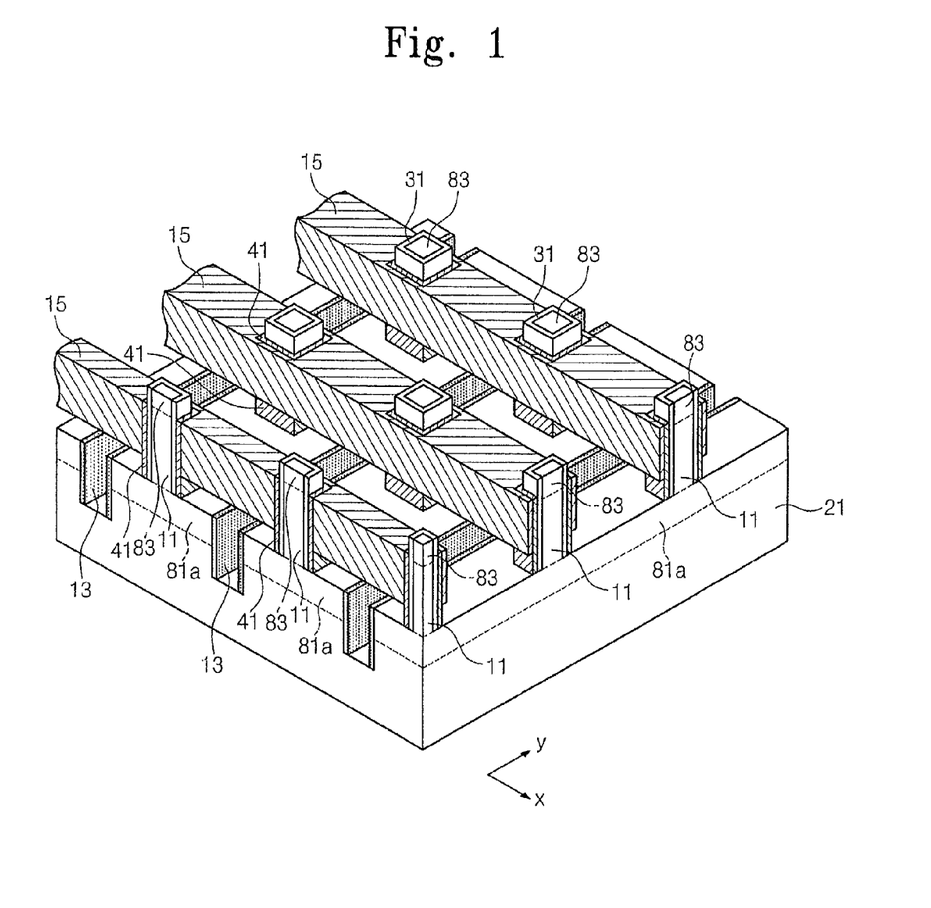
FIG. 1 is a perspective view illustrating a semiconductor device according to one embodiment.

FIG. 1 is a perspective view illustrating a semiconductor device according to one embodiment.

Referring to FIG. 1, a plurality of channel structures 11 may be two dimensionally arranged in rows and columns on a semiconductor substrate 21. The channel structures 11 may protrude from the semiconductor substrate 21 to have pillar-type configurations. An upper junction region 83 (e.g., a source region) and a lower junction region 81a (e.g., a drain region) may be disposed at an upper end and a lower end of each channel structure 11. A gate pattern 41 may be provided on a sidewall of the channel structure 11. The channel structure 11, the gate pattern 41 on sidewall of the channel structure 11, and the source and drain regions 83 and 81a disposed at both ends of the channel structure 11 may collectively constitute a vertical transistor. A buried bit line 13 may extend in a column direction (i.e., in a y-direction) and may be electrically connected to the lower junction regions 81a, for example, the drain regions of the vertical transistors arranged in a corresponding column. A word line 15 may extend in a row direction (i.e., in an x-direction) and may be electrically connected to the gate patterns 41 of the vertical transistors are arranged in a corresponding row.

As can be seen from FIG. 1, the channel structures 11 may have a rectangular-type shape when viewed from a horizontal sectional view. However, the channel structures 11 may exhibit various shapes in the horizontal sectional view. For example, the channel structures 11 may have a circular-type shape in the horizontal sectional view.

Figure 2A:
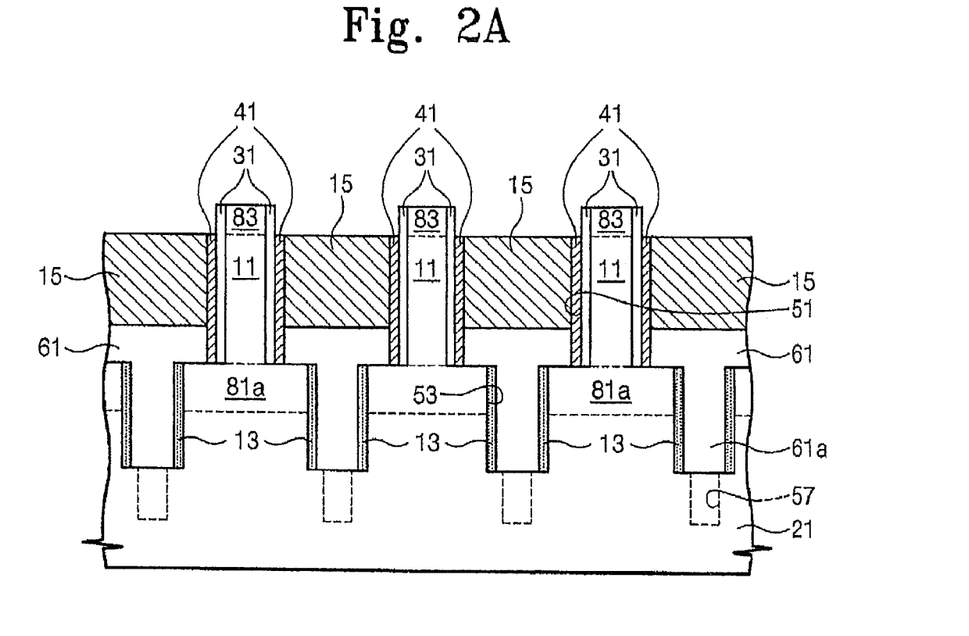
FIGS. 2A and 2B are vertical sectional views taken along a word line direction and a bit line direction of FIG. 1.
Figure 2B:
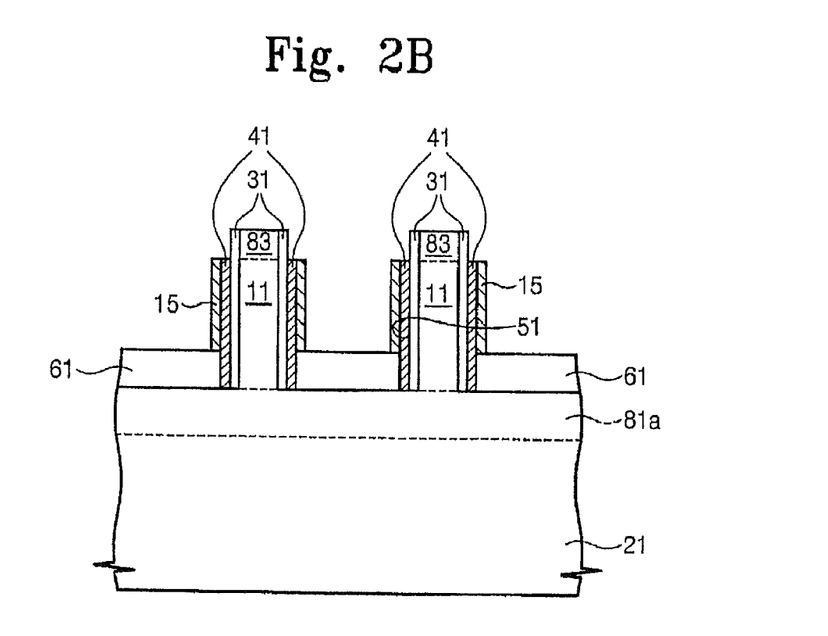

The semiconductor device shown in FIG. 1 will now be described in more detail with reference to FIGS. 2A and 2B, wherein FIG. 2A illustrates a vertical sectional view taken along the word line direction (i.e., along the x-direction) and FIG. 2B illustrates a vertical sectional view taken along the bit line direction (i.e., along the y-direction).

Referring to FIGS. 2A and 2B, a plurality of channel structures 11 may protrude above the substrate 21. Each channel structure 11 may be formed by etching a portion of the semiconductor substrate 21. A gate pattern 41 may be insulated from the channel structure 11 by a gate insulation layer 31. The gate pattern 41 may be formed on a sidewall of the channel structure 11. Gate patterns 41 within a single row may be electrically connected to each other via a word line 15. Each word line 15 may be disposed in a first groove 51 (also referred to herein as a 'word line groove') defined between adjacent channel structures 11. Second grooves 53 (also referred to herein as 'bit line grooves') may be provided in the substrate 21 below the word lines 15, and the word lines 15 may cross over the second grooves 53. Each second groove 53 exposes drain regions 81a and the bit line 13 is disposed on sidewalls of the second grooves 53. Accordingly, each bit line 13 electrically connects drain regions 81a arranged within a column, as shown in FIG. 1.

Each bit line 13 may be electrically insulated from a corresponding gate pattern 41 and word line 15 by an isolation layer 61. The isolation layer 61 may be provided in lower portions of the word line grooves 51 and in the bit line grooves 53. In some embodiments, the isolation layer 61 may electrically insulate bit lines 13 within a bit line groove 53 from each other. Further, third grooves (also referred to herein to as 'isolation grooves') may be provided under the bit line groove 53 for better electrical isolation between bit lines 13 within a bit line groove 53, and the third groove may also be filled with the isolation layer 61. In one embodiment, each isolation groove may have a sidewall and a bottom surface as exemplarily illustrated by the dashed lines 57 in FIG. 2A. It will be appreciated, however, that the isolation groove may be configured in any suitable manner.

The aforementioned embodiments may be applied to a cell array region of a semiconductor memory device such as a dynamic random access memory (DRAM) device. In this case, the upper junction regions 83 may be electrically connected to capacitors of corresponding DRAM cells.

The gate pattern 41 and the word line 15 may include, for example, polysilicon, metal silicide, metal, or the like or a combination layer thereof, and the bit line 13 may, for example, include cobalt silicide.

Methods of fabricating a semiconductor device according to one embodiment will be exemplarily described in greater detail with reference to FIGS. 3 to 8 wherein FIGS. 3 to 8 are cross sectional views taken along the word line direction shown in FIG. 1.

Figure 3:
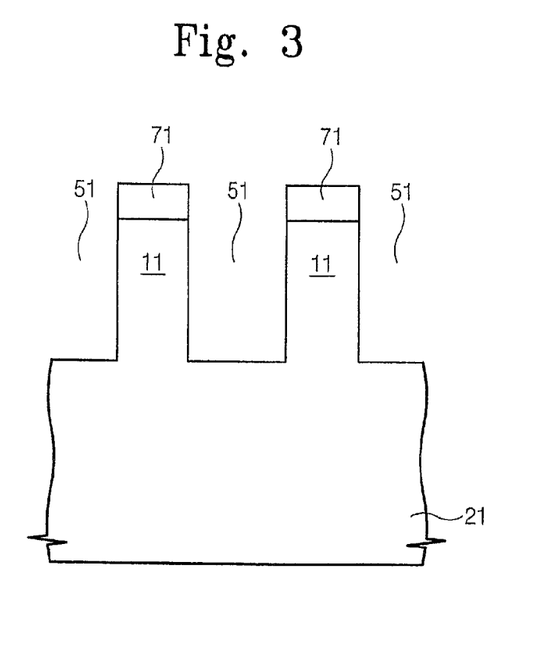
FIGS. 3 to 8 are vertical sectional views taken along a word line direction of FIG. 1 to exemplarily illustrate methods of forming a semiconductor device according to one embodiment.

Referring to FIG. 3, a plurality of masks 71 (also referred to herein as 'channel masks') are formed on a semiconductor substrate 21. The channel masks 71 may be formed to be two-dimensionally arranged in rows and columns on the semiconductor substrate 21. The channel masks 71 may include, for example, silicon oxide, silicon nitride, silicon oxynitride, or the like or a combination thereof. The semiconductor substrate 21 is etched using the channel masks 71 as etch masks, thereby forming a plurality of channel structures 11 under the channel masks 71. A word line groove 51 is thereby defined between the channel structures 11 in each row.

Figure 4:
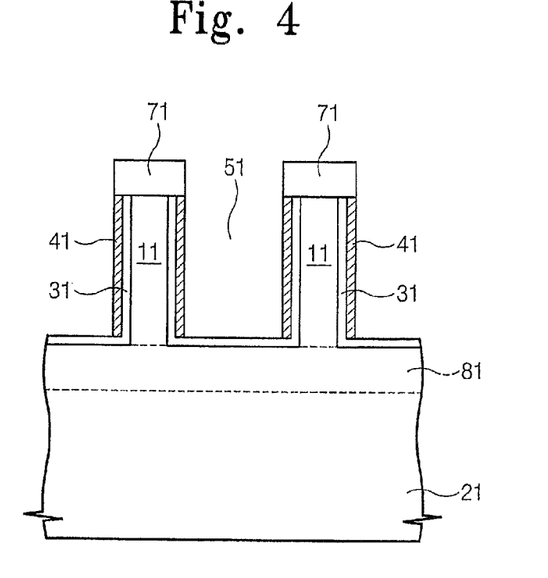

Referring to FIG. 4, sidewalls of each channel structure 11 may be optionally etched to reduce the width thereof. For example, the channel structures 11 may be isotropically etched using a wet etchant. It will be appreciated, however, that the isotropic etching process may be omitted. A gate insulation layer 31 may be formed on a sidewall of the channel structures 11. The gate insulation layer 31 may be formed according to, for example, a thermal oxidation technique, a chemical vapor deposition (CVD) technique, or the like or a combination thereof. A gate pattern 41 may then be formed on the gate insulating layer 31, for example, to surround the outer sidewall of the channel structure 11.

In one embodiment, the gate pattern 41 may be formed by conformably depositing a gate conductive layer on the substrate having 21 the gate insulation layer 31 and then etching back the gate conductive layer. The gate conductive layer may include, for example, polysilicon, metal silicide, metal, or the like or a combination thereof. In another embodiment, the gate pattern 41 may be formed by depositing a gate conductive layer on the substrate 21 having the gate insulation layer 31, planarizing the gate conductive layer until the channel masks 71 are exposed and anisotropically etching the planarized conductive layer using the exposed channel masks 71 as etching masks.

Impurity ions may be implanted into the semiconductor substrate 21 to form an impurity layer 81 located within the portions of the semiconductor substrate 21 under the channel structure 11 and in portions of the semiconductor substrate between the channel structures 11. In another embodiment, however, the impurity layer 81 may be formed before forming the channel masks 71.

Figure 5:
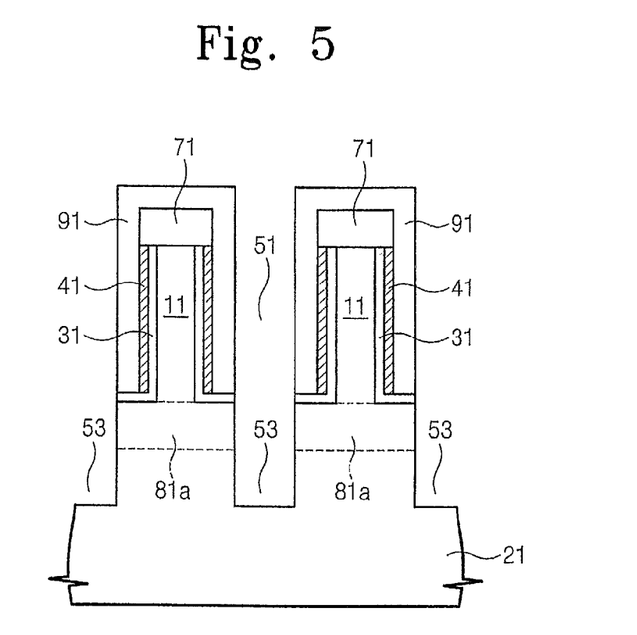

Referring to FIG. 5, masks 91 for defining bit lines (hereinafter, may be referred to as bit line masks for better understanding) may be formed on the substrate having the impurity layer 81 and the gate pattern 41. Each bit line mask 91 may be formed to cover corresponding channel masks 71 and gate patterns 41 that are arranged within the same column. Portions of the gate insulation layer 31 and the impurity layer 81 not covered by the bit line masks 91 may then b be etched using the bit line masks 91 as etching masks, thereby forming a plurality of bit line grooves 53 that divide the impurity layer 81 into a plurality of drain regions 81a. At this time, a plurality of drain regions 81a are formed such that drain regions 81a within a column are spaced apart from drain regions 81a within an adjacent column. In addition, adjacent channel structures 11 within a row are electrically isolated from each other. The bit line masks 91 may include, for example, silicon oxide, silicon nitride, silicon oxynitride, or the like or a combination thereof.

Figure 6:
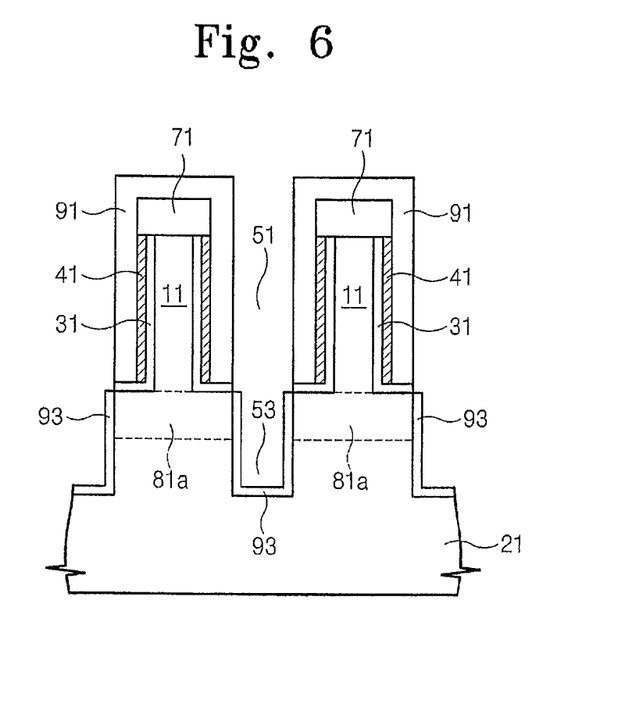

Referring to FIG. 6, a metal layer 93 may be selectively formed on inner walls (e.g., on a sidewall and a bottom surface) of the bit line grooves 53. Accordingly, the metal layer 93 may be selectively formed on the semiconductor substrate 21. In some embodiments, the metal layer 93 may be include, for example, cobalt, nickel, titanium, platinum, palladium, or the like or combinations thereof, formed according to an electroless deposition process. Accordingly, the metal layer 93 may be formed to a substantially uniform thickness throughout the sidewall and bottom surfaces of each bit line groove 53. In other words, the metal layer 93 may be formed without any overhangs on upper regions of sidewalls of the bit line grooves 53.

In one embodiment, an electroless deposition process for selectively forming the metal layer 93 may comprise activating (i.e., treating) the inner wall of the bit line groove 53. The activation process may include, for example, changing a surface condition of the inner wall of the bit line groove 53 so that the metal layer 93 is selectively and substantially uniformly grown while the electroless deposition process is performed. In one embodiment, the activation process may include forming a seed layer on the inner wall of the bit line groove 53. In another embodiment, the activation process may include contacting the inner wall of the bit line groove 53 an activator (e.g., a cleaner or conditioner such as surfactant) containing metal, metal chloride, metal sulfate or combination thereof.

In some embodiments, the activator may include, for example, palladium (Pd) or palladium chloride ($PdCl_2$). It will be appreciated, however, that the activator may contain a material other than a metal, metal chloride, or metal sulfate. The inner wall of the bit line groove 53 may be contacted with the activator by immersing the substrate having the bit line groove 53 into the activator.

Subsequently, the activated inner wall of the bit line groove 53 may be contacted with a reactant containing a metal ion source and a reducing agent in order to grow the metal layer 93 using an electroless deposition process. The activated inner wall of the bit line groove 53 may be contacted with the reactant by immersing the substrate having the activated inner wall of the bit line groove 53 into the reactant. In embodiments where the metal layer 93 includes cobalt, a cobalt ion source such as cobalt sulfate ($CoSO_4$) may be used as the metal ion source and the reducing agent may contain hydrophosphate ($H_3PO_4$) ions, boron, or combinations thereof. In some embodiments, the reducing agent may include di-methyl-amine-borane (($CH_3)_2HNB_3$; DMAB), formaldehyde (HCHO), sodium hypophosphate ($NaH_2PO_2$), sodium hydroborate ($NaBH_4$), or potassium hydroborate ($KBH_4$). The reactant may further include buffer solution such as pH controller or surfactant. For example, the buffer solution may include acetic acid ($CH_3COOH$) or ammonium hydrate.

Figure 7:
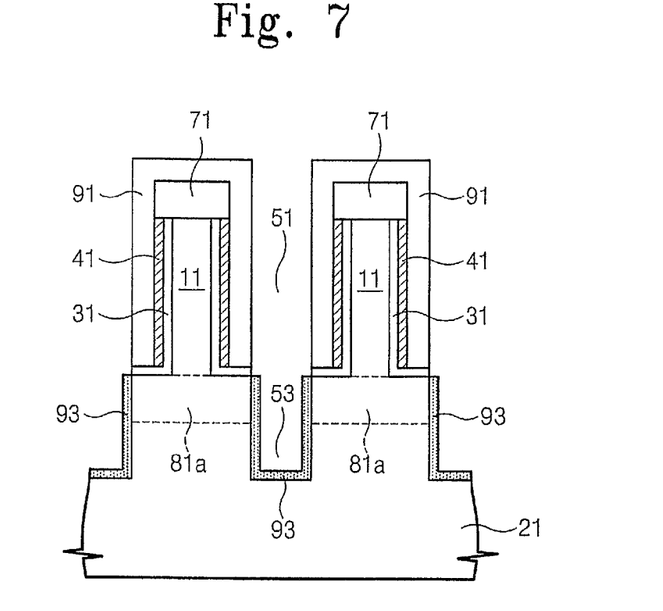

Referring to FIG. 7, a silicidation process may be performed, thereby reacting the metal layer 93 with the semiconductor substrate (e.g., a silicon substrate) being in contact therewith to selectively form a metal silicide layer 95 on the inner wall of the bit line groove 53. In embodiments where the metal layer 93 includes cobalt, the metal silicide layer 95 may include cobalt silicide. In one embodiment, the silicidation process may comprise a first annealing process. The first annealing process may be performed at a temperature within the range of about 200 degrees Celsius to about 1000 degrees Celsius and under a pressure within the range of about $10^{-8}$ torr to about 5×760 torr. In one embodiment, the first annealing process may be performed in an ambient gas including an inert gas, an inactive gas, or the like or a combination thereof. The inert gas may include, for example, argon, helium, or the like or a combination thereof and the inactive gas may include, for example, nitrogen, hydrogen, or the like or a combination thereof. In another embodiment, the first annealing process may be performed in the absence of the ambient gas.

In another embodiment, the silicidation process may further comprise a second annealing process that is performed after the first annealing process. The second annealing process may also be performed under a specific condition within the ranges of the process parameters (e.g., temperature, pressure and ambient gas) of the first annealing process. In one embodiment, the second annealing process may be carried out using the same process condition as the first annealing process or using a different process condition from the first annealing process, within the same process ranges of the first annealing process. In another embodiment, at least one of the process parameters of the second annealing process may be outside the range of the corresponding parameter of the first annealing process. For example, the second annealing process may be performed at a temperature below about 200 degrees Celsius.

If a portion of the metal layer 93 is not reacted with the semiconductor substrate after the first annealing process, then the unreacted portion of the metal layer may be removed before performing the second annealing process.

Figure 8:
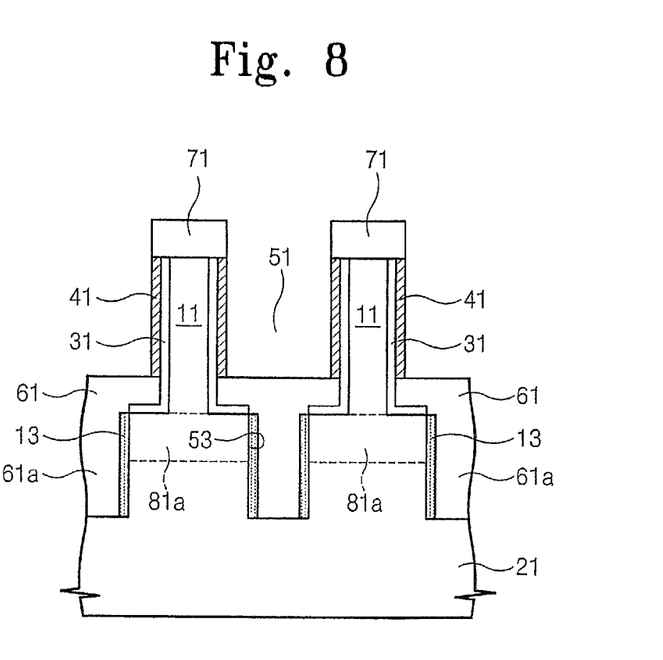

Referring to FIG. 8, portions of the metal silicide layers 95 on the bottom surface of each bit line groove 53 may be removed to form buried bit lines 13 which are electrically isolated from each other in each of the bit line grooves 53. The portions of the metal silicide layers 95 on the bottom surfaces of the bit line grooves 53 may be selectively removed using an anisotropic etching process that employs a fluorine-based gas as an etching gas. The fluorine-based gas may comprise at least one of a $NF_3$ gas, a $CF_4$ gas and a $CHF_3$ gas. Further, the anisotropic etching process may be performed using an inert gas such as an argon gas.

The bit line masks 91 may then be removed, and an isolation layer 61 may be formed within the bit line grooves 53. A conductive layer may then be formed on the substrate having the isolation layer 61 and be patterned to form word lines (15 of FIGS. 1, 2A and 2B), which are electrically connected to the gate patterns 41. Impurity ions may then be implanted into upper regions of the channel structures 11 to form source regions (83 of FIGS. 1, 2A and 2B).

In the some embodiments, the activation of the inner wall of the bit line groove 53 may be omitted. In this case, a metal layer such as a cobalt layer may be selectively formed on the silicon surface of the semiconductor substrate 21 using an epitaxial growth technique since the lattice structure of cobalt is similar to that of the silicon surface of the semiconductor substrate 21.

In some embodiments, the bit line masks 91 may be removed after forming the isolation layer 61.

In some embodiments, portions of the semiconductor substrate 21 under the bit line grooves 53 may be removed (e.g., etched) to form isolation grooves (e.g., such as those exemplarily illustrated in FIG. 2A) after forming the buried bit lines 13 and before forming the isolation layer 61. Such isolation grooves may provide better isolation between the buried bit lines 13 in each bit line groove 53.

In some embodiments, the channel masks 71 may be removed before forming the source regions 83.

In some embodiments, the source regions 83 may be formed before forming the bit line masks 91. In such embodiments, the channel masks 71 may be removed before forming the source regions 83.

In some embodiments, the drain regions 81a may be formed after forming the bit line grooves 53.

Figure 9:
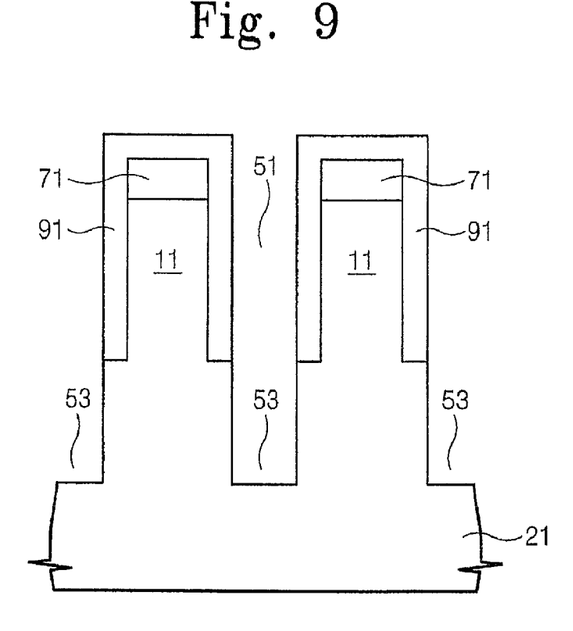
FIGS. 9 to 11 are vertical sectional views taken along a word line direction of FIG. 1 to exemplarily illustrate methods of forming a semiconductor device according to another embodiment.
Figure 10:
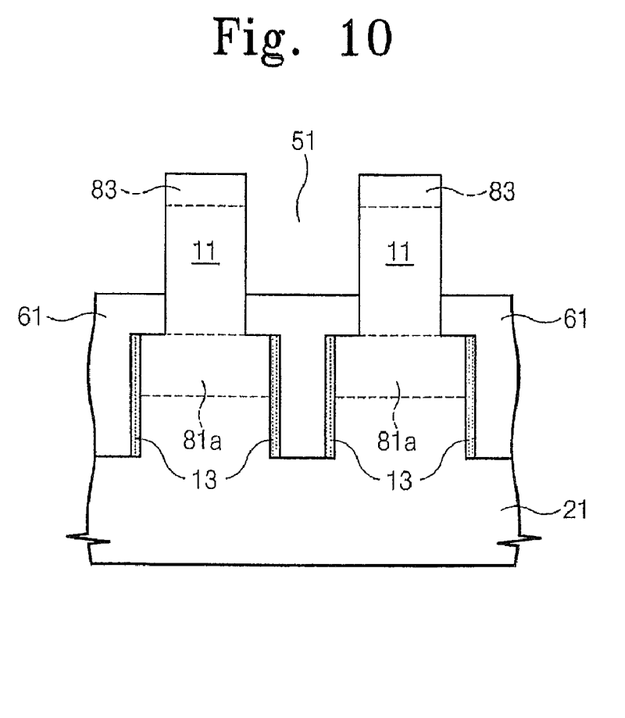
Figure 11:
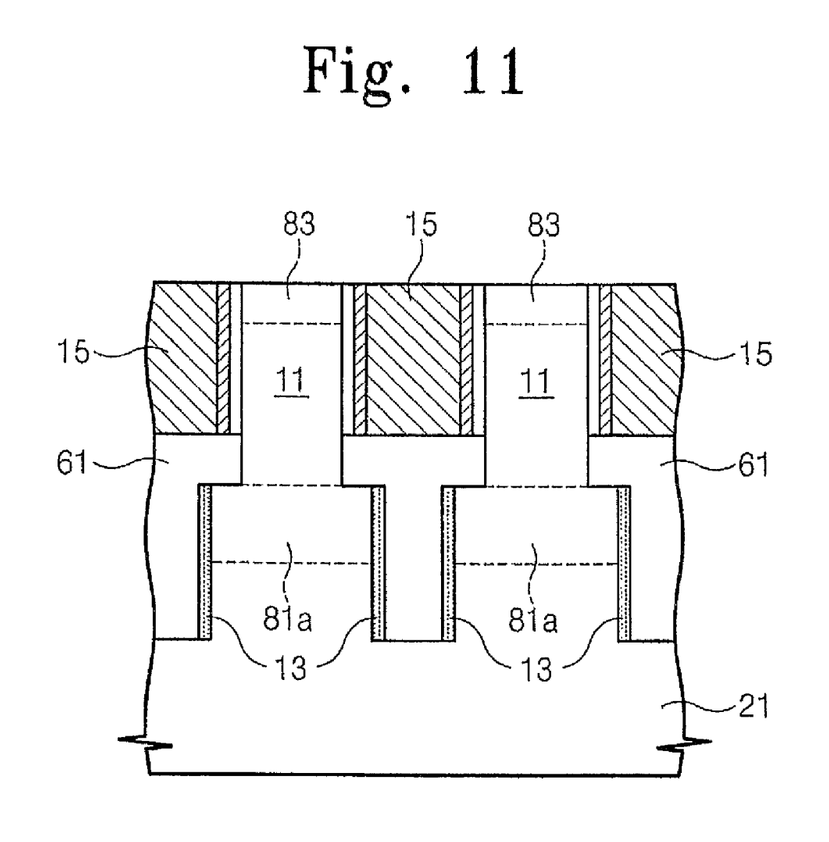

In some embodiments, the buried bit line 13 may be formed before forming the gate pattern 41 and the word line 15, as illustrated in FIGS. 9 to 11. FIGS. 9 to 11 are cross sectional views taken along a word line direction of FIG. 1.

Referring to FIG. 9, channel masks 71 and channel structures 11 may be formed, for example, according to the same process as exemplarily described with reference to FIG. 3. Bit line masks 91 and bit line grooves 53 may then be formed, for example, according using the same process as exemplarily described with reference to FIG. 5.

Referring to FIG. 10, buried bit lines 13 may be formed on sidewalls of the bit line grooves 53 using, for example, the same process as exemplarily described with reference to FIGS. 6, 7 and 8. The bit line masks 91 and the channel masks 71 may then be removed, and source regions 83 may be formed in upper regions of the channel structures 11. An isolation layer 61 may be formed to fill the bit line grooves 53.

Referring to FIG. 11, after the isolation layer 61 is formed, the gate insulation layers 31 and gate patterns 41 may be formed using, for example, the same process as exemplarily described with reference to FIG. 4. Word lines 15, which are electrically connected to the gate patterns 41, may then formed.

In some embodiments, the source regions 83 and drain regions 81a may be formed according to the processes as described in the aforementioned embodiments.

According to the embodiments exemplarily described above, bit line grooves may be formed in a semiconductor substrate and metal layers may be uniformly and selectively formed on inner walls of the bit line grooves using an electroless deposition process. Therefore, a pair of metal silicide lines having low electrical resistance may be formed in each bit line groove.

Further, each metal silicide line of the pair of metal silicide lines within each bit line groove may be electrically separated from the other to form reliable buried bit lines.

While the embodiments of the present invention have been exemplarily shown and described above, it will be understood by those of ordinary skill in the art that various changes in form and details may be made therein without departing from the spirit and scope of the present invention as defined by the following claims.

That which is claimed is:

1. A semiconductor device comprising:
    a semiconductor substrate having an upper surface;
    a plurality of channel structures on the substrate, each channel structure having a sidewall extending from the upper surface of the semiconductor substrate to a height above the upper surface of the semiconductor substrate;
    a plurality of gate patterns formed on sidewalls of corresponding ones of the plurality of channel structures;
    a bit line groove defined between sidewalls of adjacent ones of the plurality of channel structures, the bit line groove having opposing sidewalls; and
    a plurality of bit lines formed on corresponding ones of the opposing sidewalls, wherein the plurality of bit lines are electrically isolated from each other.

2. The semiconductor device of claim 1, further comprising an isolation layer formed between the plurality of bit lines within the bit line groove.

3. The semiconductor device of claim 2, further comprising an isolation groove defined in the semiconductor substrate below the bit line groove, wherein the isolation layer is formed within the isolation groove.

4. The semiconductor device of claim 2, further comprising a plurality of word lines electrically connected to corresponding ones of the plurality of gate patterns, wherein the plurality of bit lines and the plurality of word lines are electrically isolated from each other by the isolation layer.

5. The semiconductor device of claim 1, wherein the plurality of bit lines comprise a metal silicide.

* * * * *